United States Patent
Jin et al.

(10) Patent No.: US 11,011,320 B2
(45) Date of Patent: May 18, 2021

(54) BUS STOP USING LARGE-SCALE PEROVSKITE SOLAR CELL

(71) Applicant: Pusan National University Industry-University Cooperation Foundation, Busan (KR)

(72) Inventors: Sung Ho Jin, Busan (KR); Jinhwan Yoon, Busan (KR); Heon Cheol Shin, Busan (KR); Yang Do Kim, Busan (KR); Jin Woo Oh, Busan (KR); Sung Il Ahn, Susan (KR); Hyun Deog Yoo, Seoul (KR); Hyung Woo Lee, Busan (KR); Mi Ra Kim, Busan (KR)

(73) Assignee: Pusan National University Industry-University Cooperation Foundation, Busan (KR)

( * ) Notice: Subject to any disclaimer, the term of this patent is extended or adjusted under 35 U.S.C. 154(b) by 0 days.

(21) Appl. No.: 16/995,218

(22) Filed: Aug. 17, 2020

(65) Prior Publication Data
US 2021/0065991 A1    Mar. 4, 2021

(30) Foreign Application Priority Data

Sep. 3, 2019  (KR) .......................... 10-2019-0108503

(51) Int. Cl.
*H01G 9/20* (2006.01)
*H02S 20/10* (2014.01)
(Continued)

(52) U.S. Cl.
CPC ......... *H01G 9/2022* (2013.01); *E04H 1/1211* (2013.01); *F21S 9/035* (2013.01);
(Continued)

(58) Field of Classification Search
None
See application file for complete search history.

(56) References Cited

U.S. PATENT DOCUMENTS

| 2013/0033222 A1* | 2/2013 | Hixson | H02S 20/10 |
| | | | 320/101 |
| 2015/0056736 A1* | 2/2015 | Beck | H01L 31/075 |
| | | | 438/64 |

(Continued)

FOREIGN PATENT DOCUMENTS

| CN | 204332278 U * | 5/2015 |
| KR | 10-0847374 B1 | 7/2008 |

(Continued)

OTHER PUBLICATIONS

NASA, New Map Offers a Global View of Health-Sapping Air Pollution, Sep. 22, 2010 "https://www.nasa.gov/topics/earth/features/health-sapping.html", All Pages. (Year: 2010).*

(Continued)

*Primary Examiner* — Daniel P Malley, Jr.
(74) *Attorney, Agent, or Firm* — Paratus Law Group, PLLC

(57) ABSTRACT

Disclosed is a bus stop using a large-scale perovskite solar cell in which a perovskite solar cell is prepared using a hybrid structure including a graphene-carbon nanotube. The bus stop includes a body unit fixed to the ground to maintain the overall shape, a solar cell unit for producing electrical energy from sunlight, and an energy storage system (ESS) for storing the electrical energy produced by the solar cell part.

11 Claims, 8 Drawing Sheets

(51) Int. Cl.
    *F21S 9/03*      (2006.01)
    *F21V 23/04*     (2006.01)
    *G01N 15/06*     (2006.01)
    *E04H 1/12*      (2006.01)
    *H02S 40/38*     (2014.01)
    *H02S 40/32*     (2014.01)

(52) U.S. Cl.
    CPC ......... *F21V 23/0471* (2013.01); *G01N 15/06* (2013.01); *H02S 20/10* (2014.12); *G01N 2015/0693* (2013.01); *H01G 9/2027* (2013.01); *H01G 9/2077* (2013.01); *H02S 40/32* (2014.12); *H02S 40/38* (2014.12)

(56) References Cited

U.S. PATENT DOCUMENTS

2017/0222162 A1\* 8/2017 Lee ................ H01L 51/0034
2020/0350125 A1\* 11/2020 Park ................ H01L 51/448

FOREIGN PATENT DOCUMENTS

| KR | 10-2011-0112968 | A |   | 10/2011 |
|----|-----------------|---|---|---------|
| KR | 10-2013-0119298 | A |   | 10/2013 |
| KR | 10-1471725      | B1|   | 12/2014 |
| KR | 10-2018-0065226 | A |   | 6/2018  |
| KR | 101937097       | B1| \* | 1/2019 |
| KR | 10-2019-0073895 | A |   | 6/2019  |

OTHER PUBLICATIONS

English machine translation of Guoliang (CN-204332278-U) provided by the EPO website. 2021. All Pages. (Year: 2021).\*
English machine translation of Lee et al. (KR-101937097-B1) provided by the EPO website. 2021. All Pages. (Year: 2021).\*
English machine translation of Guoliang (CN 204332278 U) provided by the EPO website. All Pages. 2021. (Year: 2021).\*
Korean Office Action for related KR Application No. 10-2019-0108503 dated Mar. 30, 2021 from Korean Intellectual Property Office.
Dong Suk Kim et al., Perovskite Solar Cell, Physics and Advanced Technology, May 28, 2019, pp. 27-30, No. 5 (https://webzine.kps.or.kr/?p=4&idx=23), Korean Physics Society.

\* cited by examiner

BUS STOP USING LARGE-SCALE PEROVSKITE SOLAR CELL

CROSS-REFERENCE TO PRIOR APPLICATION

This application claims priority to and the benefit of Korean Patent Application No. 10-2019-0108503 filed on Sep. 3, 2019, which is hereby incorporated by reference in its entirety.

BACKGROUND

The present invention relates to a bus stop using a large-scale perovskite solar cell, and more particularly, to the bus stop using the large-scale perovskite solar cell in which a perovskite solar cell is prepared using a hybrid structure including a graphene-carbon nanotube to maintain the efficiency of the solar cell even in humid and oxygen conditions, check an air condition on the day by changing colors according to an ultra-fine dust level, and provide a place where a bus passenger takes a rest comfortably while waiting for the bus by enabling chairs installed in the bus stop to be cooled and heated according to an external temperature by using electricity supplied by sunlight.

In general, a bus stops at multiple bus stops spaced apart from each other along a route to pick up or drop off passengers. In the vicinity of the bus stop where the bus stops for passengers, an open temporary building is installed to provide a space for passengers to wait to take a bus, which is called a bus stop. Such a bus stop is formed in a structure form so that passengers waiting for the bus can avoid sunlight, rain or snow for convenience.

In the case of city centers or some local roads, conventional bus stops have been supplied with power required for lighting devices, advertisements, etc. through work on a separate connection to an external power supply. However, such an external power supply is generated from power generation, such as solid fuel or nuclear energy, which has a limitation that can damage the environment and cannot cope with global energy depletion problems.

In addition, in the case of local roads with a small population, external power supply devices at the bus stops are not provided at all due to the above-mentioned construction difficulties and economic reasons. As a result, it often happened that the bus does not recognize the presence of passengers and passes the bus stop at night, the bus collides with passengers finding the bus and coming forward to cause an accident, or there are vulnerabilities to passenger convenience and safety, including crimes against passengers waiting for the bus in the dark.

Accordingly, in order to compensate for the above-mentioned problems, the present inventors recognized an urgent need to develop a bus stop capable of easily installing a power supply device anywhere without an external power supply, and completed the present invention.

PRIOR ART

Patent Document (Patent Document 1) Korean Patent Registration No. 10-1471725
(Patent Document 2) Korean Patent Registration No. 10-0847374

SUMMARY

An object of the present invention is to provide a bus stop using a large-scale perovskite solar cell comprising a hybrid structure using a graphene-carbon nanotube which hardly corrodes or reacts even under humid and oxygen conditions and is applied to a hole conductive layer of a perovskite solar cell to replace existing spiro-OMeTAD and maintain the photoelectric conversion efficiency of a solar cell.

Another object of the present invention is to provide a bus stop using a large-scale perovskite solar cell capable of easily checking visually a current air quality condition by varying an air quality color according to a measured value thereof by introducing a fine dust sensor that measures ultra-fine dust contained in the outdoor air into the bus stop.

Yet another object of the present invention is to provide a bus stop using a large-scale perovskite solar cell capable of providing a place where a bus passenger takes a rest comfortably while waiting for the bus by enabling chairs installed in the bus stop to be cooled and heated according to an external temperature using electricity supplied by sunlight, allowing passengers to better find bus stops even in the dark with a lighting device using LED lighting, and allowing bus drivers to safely stop at bus stops.

The objects of the present invention are not limited to the aforementioned objects, and other objects, which are not mentioned above, will be apparently understood to those skilled in the art from the following description.

In order to achieve the objects, the present invention provides a bus stop using a large-scale perovskite solar cell.

Hereinafter, this specification will be described in more detail.

The present invention provides a bus stop using a large-scale perovskite solar cell comprising: a body unit fixed to the ground to maintain the overall shape; a solar cell unit for producing electrical energy from sunlight; and an energy storage system (ESS) for storing the electrical energy produced by the solar cell unit.

In the present invention, the body unit may comprise a fine dust sensor unit for visually expressing an air quality condition by measuring ultra-fine dust contained in the air; and a lighting unit that emits light using the electrical energy stored in the energy storage system.

In the present invention, the fine dust sensor unit may comprise a measurement unit for measuring the ultra-fine dust contained in the air; and a color changing unit for visualizing a color change according to an ultra-fine dust measurement value measured by the measurement unit.

In the present invention, the color changing unit may change the color into the following cover colors according to the ultra-fine dust concentration shown in [Table 1] below.

TABLE 1

| Ultra-fine dust concentration ($\mu g/m^3$) | Cover color |
| --- | --- |
| 0 to 15 | Blue |
| 16 to 30 | Green |
| 31 to 50 | Yellow |
| 51 to 75 | Orange |
| 76 or more | Red |

In the present invention, the solar cell unit may comprise a frame installed on one side of the body unit; a perovskite solar cell fixed to the frame and formed to a large scale; and a glass positioned on the front and rear surfaces of the perovskite solar cell.

In the present invention, the perovskite solar cell may comprise a substrate (glass); an electrode layer laminated on the substrate and including a FTO (Fluorine doped Tin Oxide); a light absorbing layer laminated on the electrode layer; a perovskite layer laminated on the light absorbing layer and including a perovskite compound; and a graphene-carbon nanotube hybrid structure laminated on the perovskite layer.

In the present invention, the hybrid structure may be formed by laminating a second graphene coated with a polymer on an upper surface of a first graphene coated with a carbon nanotube.

In the present invention, the energy storage system may comprise a power conversion system (PCS) for converting the electrical energy produced by the solar cell unit; an energy storage unit for storing the electrical energy converted by the power conversion system; and an energy management system (EMS) for controlling and managing the power conversion system and the energy storage unit.

In the present invention, the power conversion system may comprise a connection unit to be coupled with the solar cell unit; an inverter that converts and outputs the electrical energy produced from the solar cell unit to be transferred through the connection unit to AC power; and a power output unit that receives the AC power converted by the inverter and converts and outputs the AC power into DC power.

In the present invention, the energy storage unit may comprise a battery for storing the DC power converted by the power conversion system; and a battery management system (BMS) for sensing, managing, and controlling the state of the battery.

In the present invention, the bus stop may further comprise a bench unit that is able to be cooled or heated using the electrical energy stored in the energy storage system; and a human body sensor unit for sensing the human body to supply power according to the presence or absence of the sensed human body.

In the present invention, the bench unit may comprise a bench body unit formed in a longitudinal direction of the body unit; a bench support unit for supporting both side surfaces of the bench body unit; and a cooling/heating unit having a plurality of frames for cooling and heating the upper surface of the bench body unit.

In the present invention, the human body sensor unit may be located in the lighting unit and the bench unit, and sense a human body approaching the bus stop through infrared rays to supply the power to the lighting unit and the bench unit.

The bus stop using the large-scale perovskite solar cell of the present invention hardly corrodes or reacts even under humid and oxygen conditions and is applied to a hole conductive layer of a perovskite solar cell to replace existing spiro-OMeTAD and maintain the photoelectric conversion efficiency of a solar cell.

In the bus stop using the large-scale perovskite solar cell of the present invention, it is possible to easily check visually a current air quality condition by varying an air quality color according to a measured value thereof by introducing a fine dust sensor that measures ultra-fine dust contained in the outdoor air into the bus stop.

Furthermore, in the bus stop using the large-scale perovskite solar cell of the present invention, it is possible to provide a place where a bus passenger takes a rest comfortably while waiting for the bus by enabling chairs installed in the bus stop to be cooled and heated according to an external temperature using electricity supplied by sunlight, allow passengers to better find bus stops even in the dark with a light device using LED lighting, and allow bus drivers to safely stop at bus stops.

The effects of the present invention are not limited to the aforementioned effect, and other effects, which are not mentioned above, will be apparent to a person having ordinary skill in the art from the description of the claims.

DETAILED DESCRIPTION

Terms used in the present invention adopt general terms which are currently widely used as possible by considering functions in the present invention, but the terms may be changed depending on an intention of those skilled in the art, a precedent, emergence of new technology, etc. Further, in a specific case, a term which an applicant arbitrarily selects is present and in this case, a meaning of the term will be disclosed in detail in a corresponding description part of the invention. Accordingly, the term used in the present invention should be defined based on not just a name of the term but a meaning of the term and contents throughout the present invention.

Unless contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

The numerical range includes numerical values defined in the above range. All maximum numerical limits given throughout this specification include all lower numerical limits as if the lower numerical limits are clearly written. All minimum numerical limits given throughout this specification include all higher numerical limits as if the higher numerical limits are clearly written. All numerical limits given throughout this specification will include all better numerical ranges within a broader numerical range, as if narrower numerical limits are clearly written.

Hereinafter, embodiments of the present invention will be described in detail, but it will be apparent that the present invention is not limited by the following embodiments.

The present invention provides a bus stop (1) using a large-scale perovskite solar cell.

Figure 1:
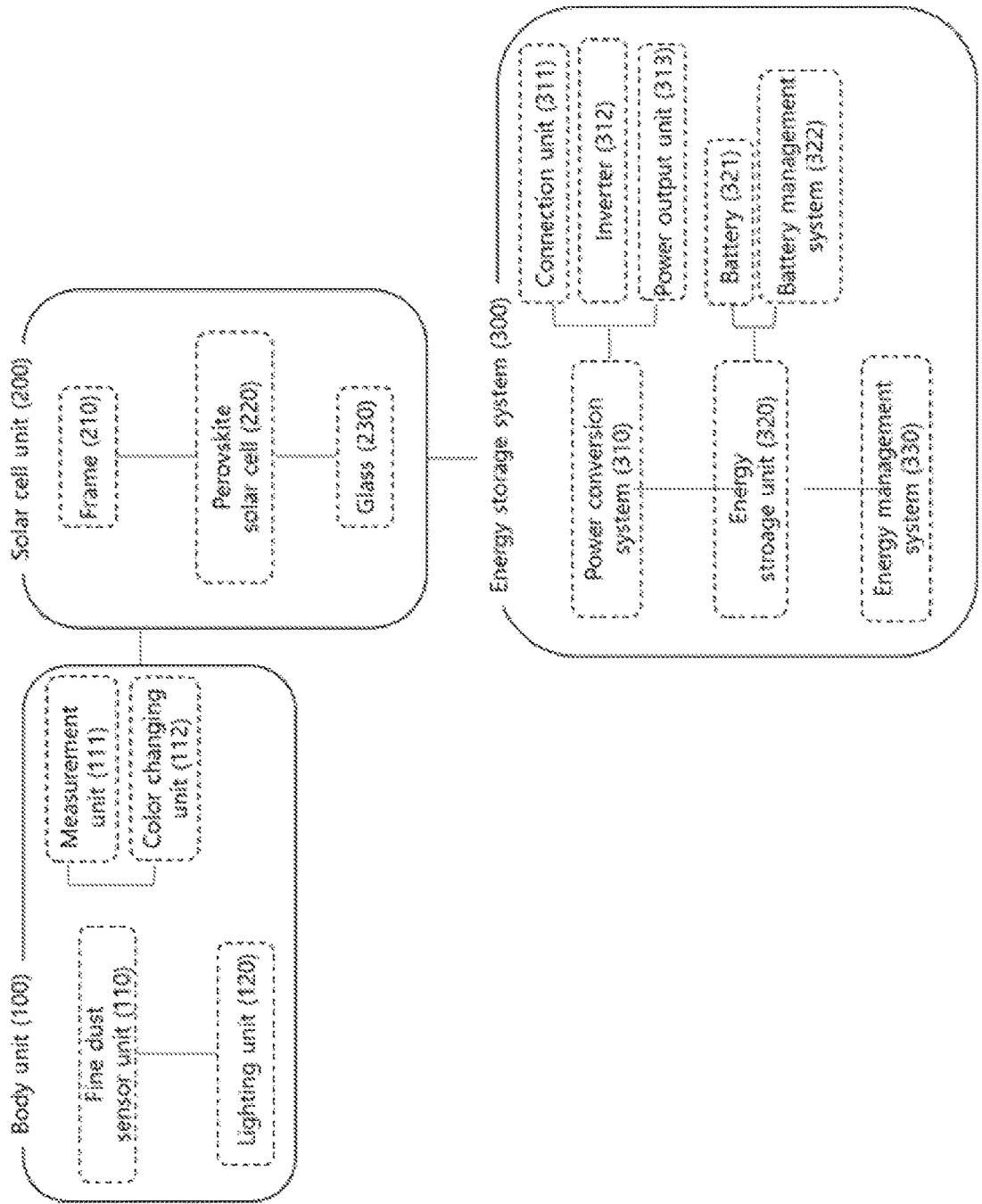
FIG. 1 is a block diagram of a configuration of constituting a bus stop using a large-scale perovskite solar cell of the present invention.
Figure 2:
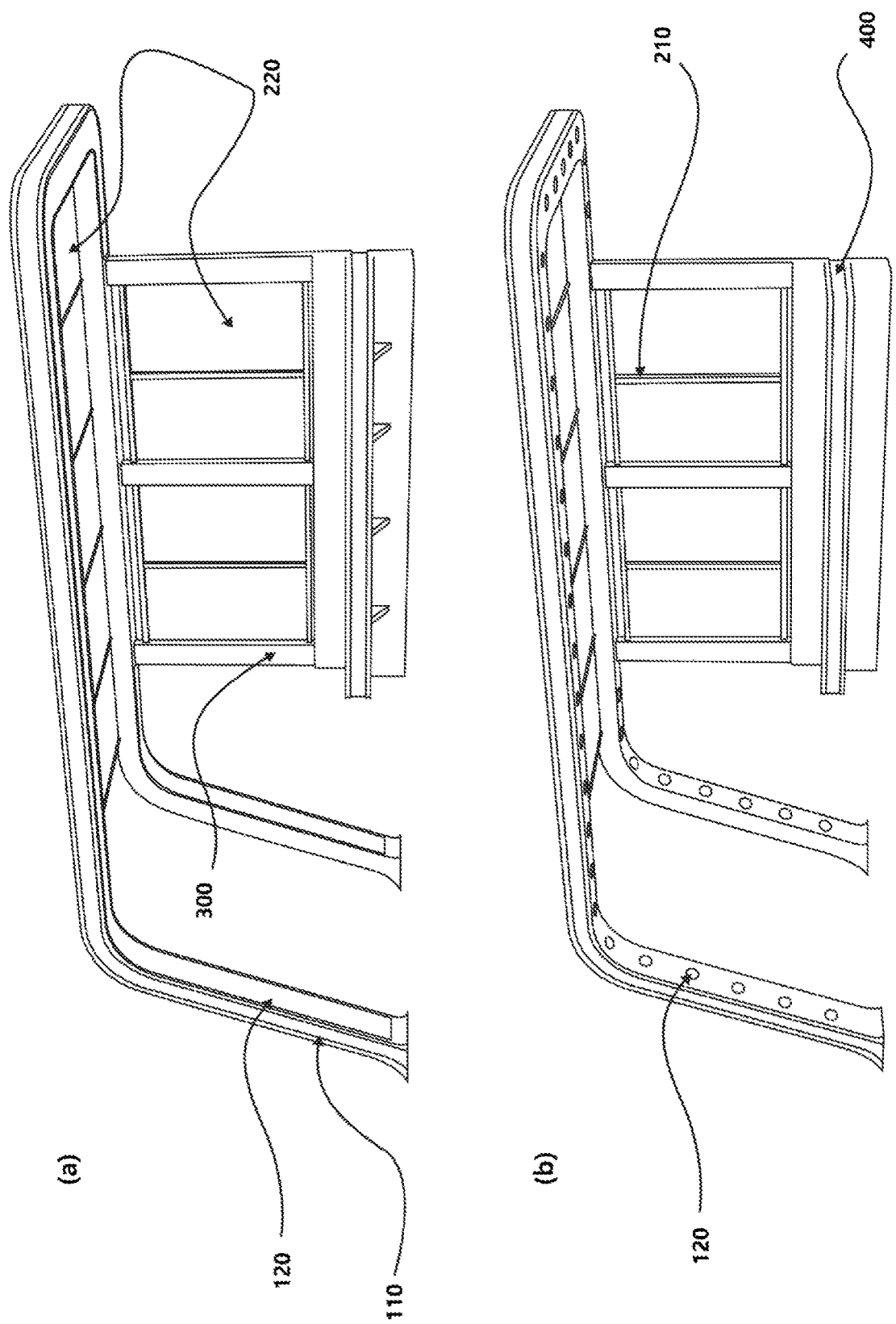
FIG. 2 is a diagram illustrating (a) a form in which a lighting unit is formed on the entire one surface of a body unit and (b) a form in which a lighting device is inserted into the body unit in the bus stop using the large-scale perovskite solar cell of the present invention.

FIG. 1 is a block diagram of a configuration of constituting a bus stop using a large-scale perovskite solar cell of the present invention and FIG. 2 is a diagram illustrating (a) a form in which a lighting unit is formed on the entire surface of a body unit and (b) a form in which a lighting device is inserted into the body unit in the bus stop using the large-scale perovskite solar cell of the present invention.

Referring to FIGS. 1 and 2, the present invention provides the bus stop (1) using the large-scale perovskite solar cell comprising a body unit (100) fixed to the ground to maintain the overall shape; a solar cell unit (200) for producing electrical energy from sunlight; and an energy storage system (300) for storing the electrical energy produced by the solar cell unit (200).

The body unit (100) is fixed to the ground and has a space provided therein in the form of a frame, and may form the entire shape of the bus stop (1).

More specifically, in the body unit (100) may be fixed to the ground on only one side or both sides may be simultaneously fixed to the ground, which can be appropriately changed according to a space in which the bus stop (1) is installed.

The body unit (100) may comprise a fine dust sensor unit (110) for visually expressing an air quality condition by measuring ultra-fine dust contained in the air; and an lighting unit (120) that emits light using the electrical energy stored in the energy storage system (300).

The fine dust sensor unit (110) may comprise a measurement unit (111) for measuring the ultra-fine dust contained in the air; and a color changing unit (112) for visualizing a color change according to an ultra-fine dust measurement value measured by the measurement unit (111).

The measurement unit (111) may measure ultra-fine dust that is a fine size of dust (PM 2.5) having a diameter of 2.5 µm or less among contaminants such as soil, metal, and sand in the air.

The measurement unit (111) may measure the ultra-fine dust by outputting light and measuring an amount of light scattered when the light and the dust collide with each other. More specifically, the measurement unit (111) may be measured through a light receiving sensor (not illustrated) constituted by a light emitting unit and a light receiving unit. The light receiving sensor (not illustrated) may output light by the light emitting unit, and at this time, measure an amount of light that passes through the light receiving unit, and convert and output the amount of light into an ultra-fine dust concentration ($µg/m^3$).

The color changing unit (112) may change the color into cover colors shown in [Table 1] below according to the ultra-fine dust concentration measured by the measurement unit 111.

TABLE 1

| Ultra-fine dust concentration ($µg/m^3$) | Cover color |
|---|---|
| 0 to 15 | Blue |
| 16 to 30 | Green |
| 31 to 50 | Yellow |
| 51 to 75 | Orange |
| 76 or more | Red |

When the cover color is changed to blue by the color changing unit (112), it is an excellent air quality condition in which outdoor activities are enabled without special restrictions. When the cover color is changed to green, it is an air quality condition in which there is no need to be particularly limited in behavior, but activities need to be attentively made according to a body condition. In addition, when the cover color is changed to yellow and orange, long or excessive outdoor activities may be restricted. Especially, in people with respiratory diseases such as asthma, it is an air quality condition that should be avoided outdoor activities. When the cover color is changed to red, there is an air quality condition in which long or excessive outdoor activities need to be restricted, and indoor activities are preferably recommended. In addition, when the concentration of the ultra-fine dust exceeds 50 $µg/m^3$ (when the cover color is orange or red), it corresponds to the fine dust emergency reduction measures, and an operation within the metropolitan air management area may be restricted for vehicles classified into 5 ratings in accordance with the vehicle exhaust emission rating system when the fine dust emergency measures are issued.

The air quality condition is visualized by the fine dust sensor unit (110) so that general persons in the corresponding area may easily recognize and determine a current condition of the ultra-fine dust in the area with the naked eye in real time.

The lighting unit (120) may emit light using the electrical energy stored in the energy storage system (300), and more specifically, may output light by outputting electricity from the energy storage system (300) in which the electrical energy produced by the solar cell unit (200) is stored.

The lighting unit (120) is an LED lighting, and may be formed on one entire surface of the body unit (100), or may be formed so that the lighting device of the body unit (100) is inserted. In addition, the lighting unit (120) outputs light only at night and does not output light at day, thereby minimizing the consumption of the electrical energy stored in the energy storage system (300).

By the lighting unit (120), the bus passenger may find the bus stop better even in the dark night (at night), and the bus driver may stop the bus safely by accurately checking a location at the bus stop.

The solar cell unit (200) may comprise a frame (210) installed on one side of the body unit (100); a perovskite solar cell (220) fixed to the frame (210) and formed in a large-scale film form; and a glass (230) positioned on the front and rear surfaces of the perovskite solar cell (220).

The frame (210) is formed to be integrally attached to the body unit (100), and may be installed to fix the perovskite solar cell (220).

In addition, the perovskite solar cell (220) may be present in the form of being inserted into the body unit (100). More specifically, the perovskite solar cell (220) may be constituted by a substrate (glass); an electrode layer laminated on the substrate and including a FTO (Fluorine doped Tin Oxide); a light absorbing layer laminated on the electrode layer; a perovskite layer laminated on the light absorbing layer and including a perovskite compound; and a graphene-carbon nanotube hybrid structure laminated on the perovskite layer.

Figure 3:
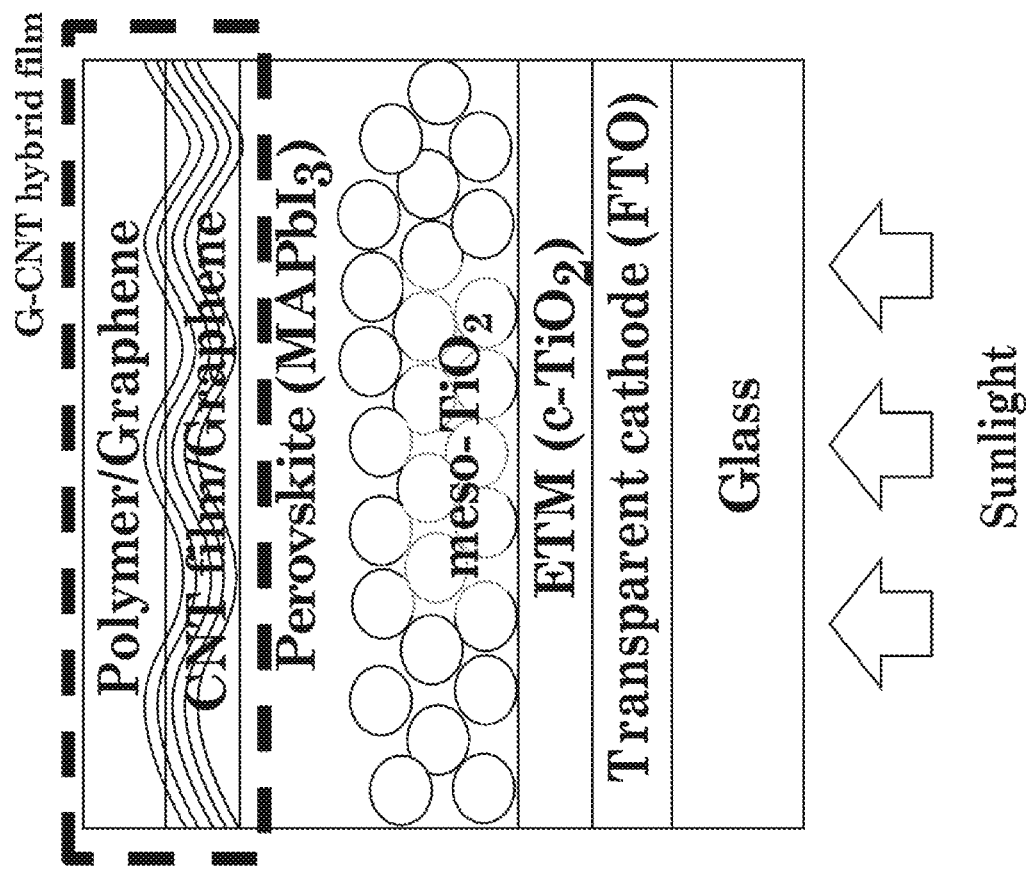
FIG. 3 is a diagram illustrating a structure of a perovskite solar cell used in the bus stop using the large-scale perovskite solar cell of the present invention.
Figure 4:
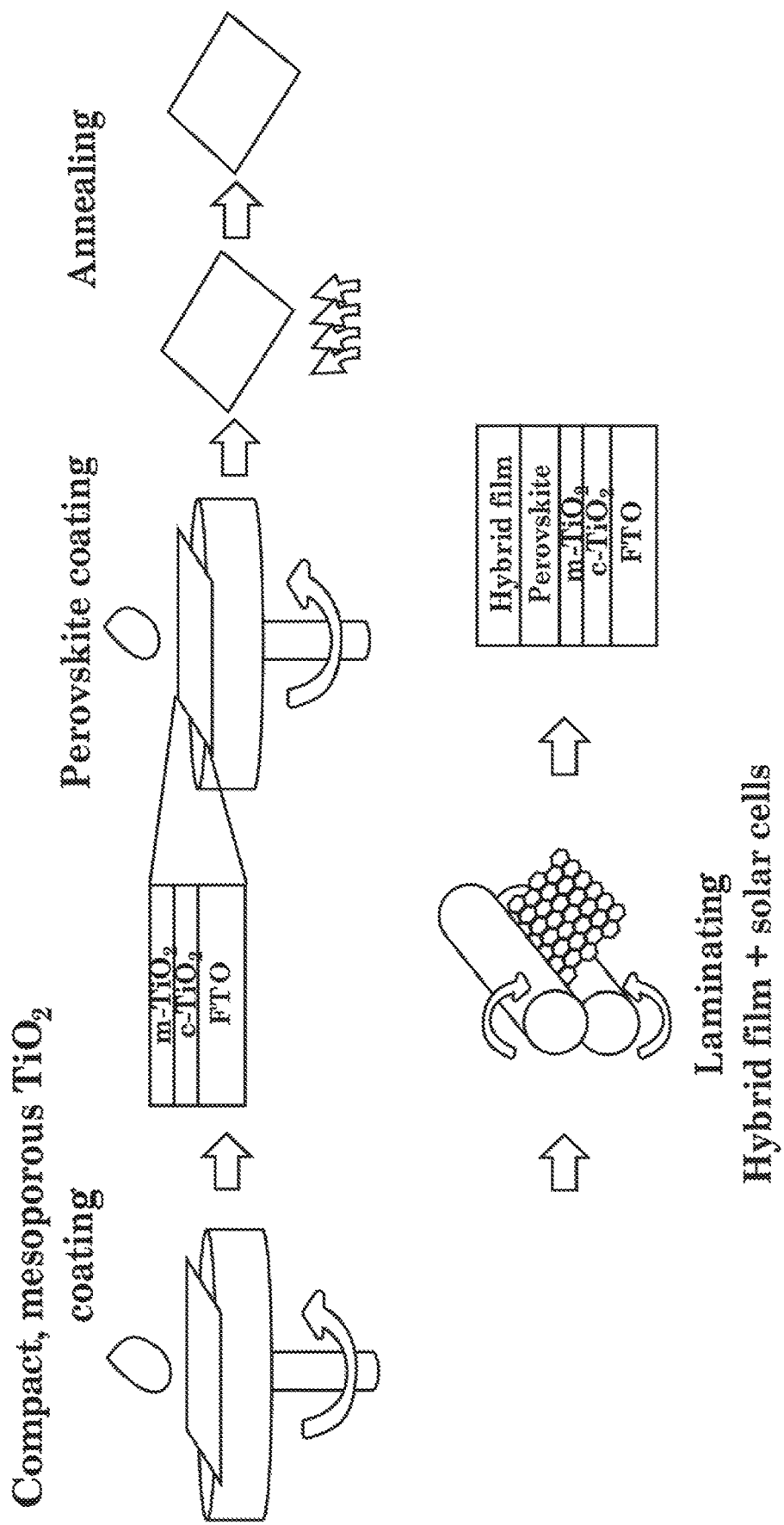
FIG. 4 is a diagram schematically illustrating a preparation method of the perovskite solar cell used in the bus stop using the large-scale perovskite solar cell of the present invention.
Figure 5:
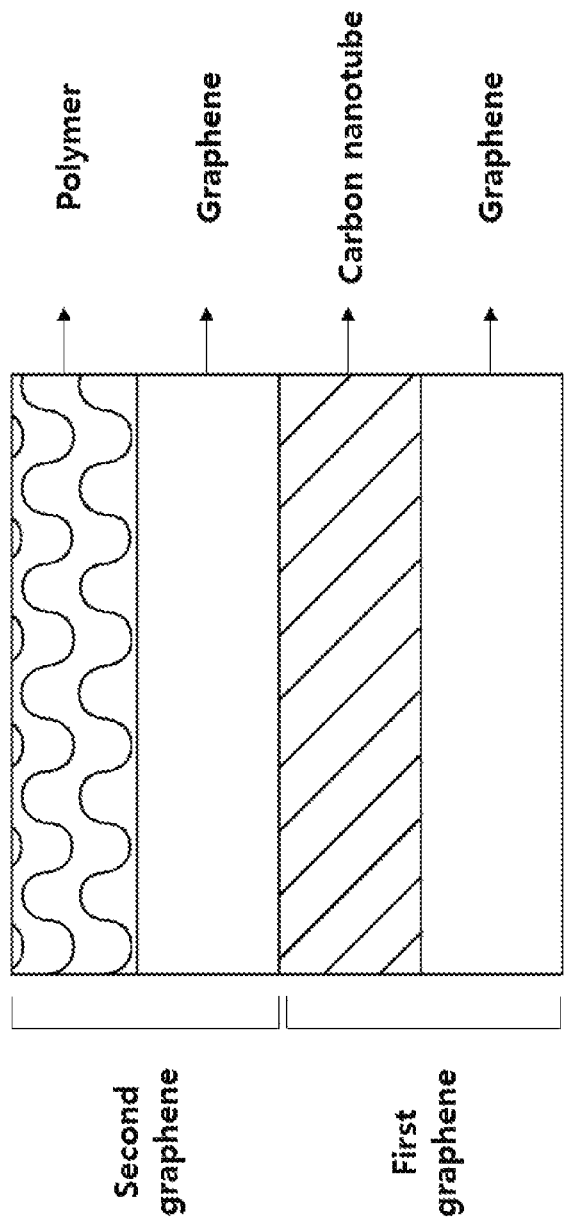
FIG. 5 is a diagram illustrating a structure of a hybrid structure used in the bus stop using the large-scale perovskite solar cell of the present invention.
Figure 6:
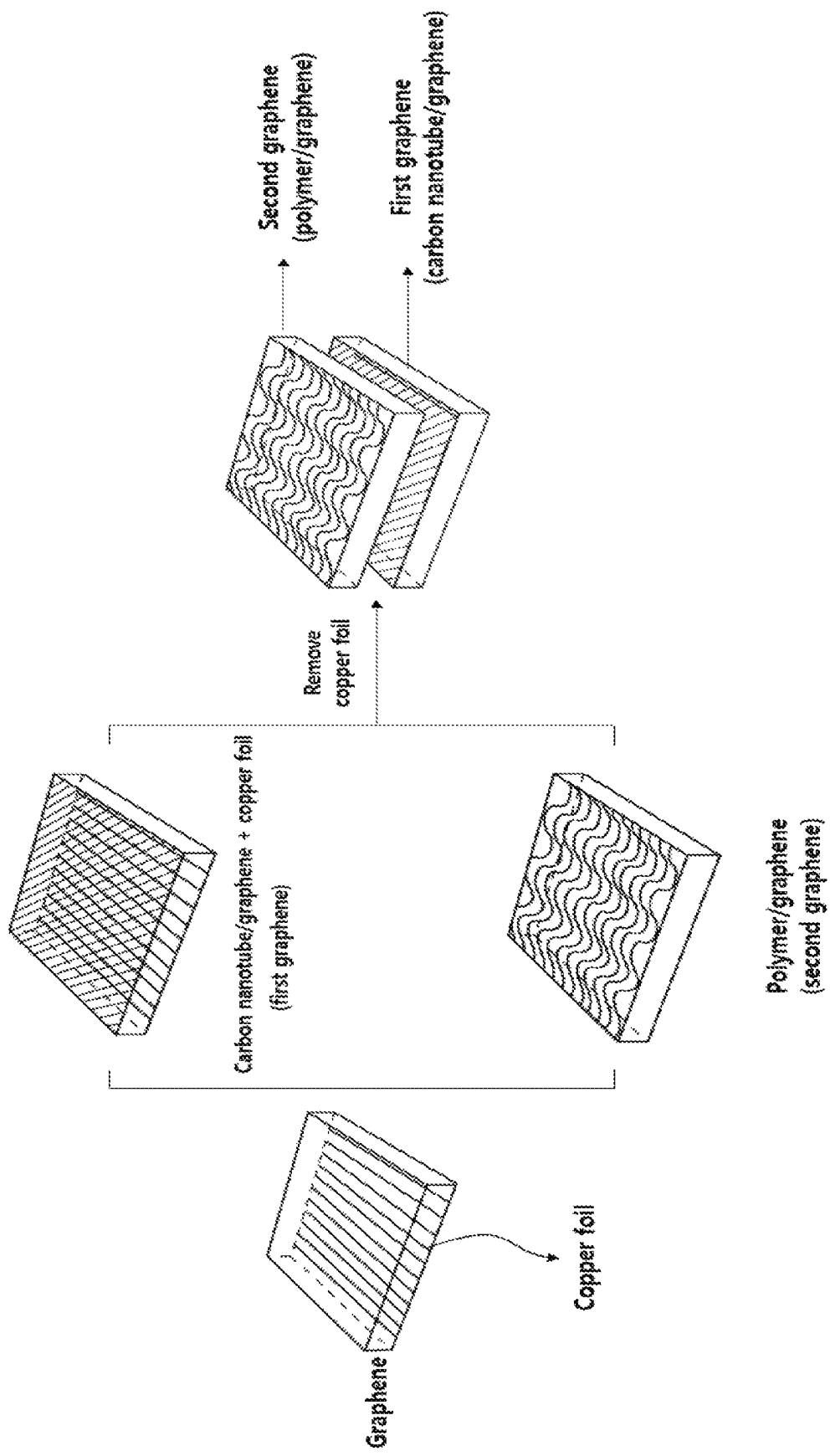
FIG. 6 is a diagram schematically illustrating a preparation method of the hybrid structure used in the bus stop using the large-scale perovskite solar cell of the present invention.

FIG. 3 is a diagram illustrating a structure of a perovskite solar cell used in the bus stop using the large-scale perovskite solar cell of the present invention, FIG. 4 is a diagram schematically illustrating a preparation method of the perovskite solar cell used in the bus stop using the large-scale perovskite solar cell of the present invention, FIG. 5 is a diagram illustrating a structure of a hybrid structure used in the bus stop using the large-scale perovskite solar cell of the present invention, and FIG. 6 is a diagram schematically illustrating a preparation method of the hybrid structure used in the bus stop using the large-scale perovskite solar cell of the present invention.

Referring to FIGS. 3 to 6, the electrode layer including the FTO (Fluorine doped Tin Oxide) is laminated on the upper surface of the substrate supporting the perovskite solar cell (220), the light absorbing layer may be laminated on the upper surface of the electrode layer, and the light absorbing layer may be configured by sequentially laminating c-TiO$_2$ and m-TiO$_2$.

The perovskite layer may include a perovskite compound as a photoactive layer of the perovskite solar cell (220), and the perovskite compound may be methylammonium lead iodide (MAPbI$_3$). In addition, the perovskite layer may additionally include a semiconductor layer, and the semiconductor layer may be included with a thickness of 1 μm or less.

The hybrid structure may be formed by laminating a second graphene coated with a polymer on an upper surface of a first graphene coated with a carbon nanotube. More specifically, the hybrid structure may be formed by dry-spinning and coating the carbon nanotube on the upper surface of the two-dimensional planar graphene.

The polymer may be at least one selected from the group consisting of poly(methyl methacrylate) (PMMA), poly (bisphenol A carbonate) (PC), polyvinylidenefluoride-hexafluoropropylene (PVDF-HFP), polyethylene oxide (PEO), polyacrylonitrile (PAN), and polyvinylalcohol (PVA), and more preferably poly(methyl methacrylate) and poly(bisphenol A carbonate).

The hybrid structure hardly corrodes or reacts even humid and oxygen conditions and is applied to a hole conductive layer of the perovskite solar cell to replace existing spiro-MeOTAD.

Further, the hybrid structure may be prepared by the following steps:

(A1) preparing a first graphene coated with a carbon nanotube by dry-spinning the carbon nanotube in a film form on an upper surface of a graphene synthesized on a copper foil surface;

(A2) preparing a second graphene coated with a polymer by spin-coating and curing the polymer on the upper surface of the graphene synthesized on the copper foil surface; and (A3) preparing a graphene-carbon nanotube hybrid structure by laminating the second graphene on the upper surface of the first graphene.

More specifically, the step (A1) may be constituted by the following steps:

(A1a) dry-spinning the carbon nanotube in the form of a film on the upper surface of the graphene synthesized on the copper foil surface;

(A1b) bonding the carbon nanotube to the upper surface of the graphene by spraying alcohol onto the graphene from which the carbon nanotube is spun; and (A1c) preparing the first graphene with the carbon nanotube coated on the upper surface by drying the alcohol.

The graphene may be synthesized and prepared on the surface of the copper foil. More specifically, a copper foil of high-purity is put in a hydrogen (H$_2$) atmosphere in a furnace of 1,000° C. to 1,100° C. for 30 minutes. In addition, the graphene synthesized on the surface of the copper foil may be prepared by reacting the copper foil in a methane (CH$_4$) condition for 30 minutes and cooling the furnace to room temperature.

The carbon nanotube may be prepared using an SiO$_2$ wafer substrate on which an iron (Fe) catalyst layer and an alumina (Al$_2$O$_3$) layer are deposited. More specifically, 3 nm-thick alumina is deposited on an Si wafer substrate having an oxide layer by evaporation of an electron beam, and then 3 to 4 nm-thick iron is deposited on the upper surface thereof. Then, the SiO$_2$ wafer substrate on which the iron catalyst is deposited is placed in a furnace of 500° C. to 550° C. in an argon (Ar) gas condition and reacts for 0.5 to 3 minutes in a hydrogen (H$_2$) gas condition. Next, the furnace is heated to 650° C. to 700° C., the carbon nanotube is grown in an acetylene (C$_2$H$_2$) and hydrogen (H$_2$) condition, and the furnace is cooled to room temperature to prepare a vertically aligned carbon nanotube.

The dry-spinning used in the step (A1a) may be performed by van der waals force.

In the step (A1b), alcohol may be sprayed onto the graphene in order to more easily bond the carbon nanotube to the upper surface of the graphene synthesized on the surface of the copper foil.

The alcohol is preferably a low alcohol of C$_1$ to C$_4$ such as methanol, ethanol, n-butanol, and isopropanol, but is not limited thereto as long as it is an alcohol that is easy to dry after spraying the alcohol.

The drying performed in the step (A1c) may be performed at room temperature, or performed by applying a predetermined temperature within a range in which the first graphene is not deformed.

The step (A2) is a step of preparing a second graphene coated with a polymer by spin-coating and curing the polymer on the upper surface of the graphene synthesized on the copper foil surface; and the step (A2) may be constituted by the following steps:

(A2a) spin-coating and curing the polymer on the upper surface of the graphene synthesized on the copper foil surface;

(A2b) removing the copper by adding the graphene to a copper etchant solution after the completion of the step (A2a); and (A2c) preparing the second graphene coated with the polymer by removing the copper etchant solution by putting the graphene in deionized water to remove the copper etchant solution.

The polymer used in the step (A2a) may be at least one selected from the group consisting of poly(methyl methacrylate), poly(bisphenol carbonate), polyvinylidenefluoride-hexafluoropropylene, polyethylene oxide, polyacrylonitrile and polyvinyl alcohol, and more preferably, at least one selected from the group consisting of poly(methyl methacrylate) and poly(bisphenol carbonate).

The spin coating performed in the step (A2a) may be performed at 1,000 to 2,000 rpm for 40 to 60 seconds, and the graphene coated with the polymer may be cured at 60 to 80° C. to be used as a support layer.

In the step (A2b), after the step (A2a) is completed, the copper may be removed by adding the copper foil to a copper etchant solution to remove the copper foil used in synthesizing the graphene. More specifically, the copper etchant solution may be added at 40 to 50° C.

The copper etchant solution may be iron chloride (Iron (III) chloride, FeCl$_3$), and is not limited thereto as long as the etchant solution is easy to remove the copper foil used to synthesize the graphene.

In the step (A2c), the second graphene coated with the polymer may be prepared by putting the graphene in deionized water to remove and wash the copper etchant solution.

The step (A3) may be constituted by the following steps:

(A3a) laminating the second graphene on the upper surface of the first graphene; and (A3b) after the step (A3a) is completed, preparing a graphene-carbon nanotube hybrid structure by adding the copper foil to the copper etchant solution to remove the copper foil used for the synthesis of the first graphene.

The step (A3a) may be to stack the second graphene on the upper surface of the first graphene. More specifically, after the second graphene is stacked on the upper surface of the first graphene, air is blown to the upper surface of the second graphene using an air gun to remove the solvent and deionized water attached to the second graphene and dried at 50 to 80° C. to stack the second graphene on the upper surface of the first graphene.

In order to remove the copper foil used in synthesizing the first graphene in the step (A3b), the copper foil may be added to the copper etchant solution. More specifically, while the first graphene and the second graphene are stacked, the copper foil may be added to the copper etchant solution to remove the copper foil used in synthesizing the first graphene. In addition, the copper etchant solution may be added at 40 to 50° C.

In the step (A3b), deionized water may be used to remove and wash the copper etchant solution.

The perovskite solar cell may be prepared in a large scale by the following steps:

(B1) laminating an electrode layer including a fluorine doped thin oxide (FTO) on a substrate and laminating and spin-coating a light absorbing layer;

(B2) after the completion of the spin-coating, performing annealing at 450 to 550° C.; (B3) after the completion of the annealing, preparing a substrate on which a perovskite layer is formed by spin-coating a perovskite compound on the light absorbing layer; and (B4) preparing a perovskite solar cell by laminating a hybrid structure on the perovskite layer with a laminator.

In the step (B1), the electrode layer including the fluorine doped thin oxide (FTO) may be laminated on the substrate and the light absorbing layer may be laminated and spin-coated.

The term "spin coating" used in the present invention is a method of preparing a thin film having a uniform thickness, and means a method of dropping a material to be coated on the substrate, and then spreading and drying the material in a large area by rotating the substrate at high speed.

The spin coating may be performed at 2,000 to 3,000 rpm for 20 to 60 seconds. After performing the spin coating, the light absorbing layer may be heat-treated at a temperature of 125 to 150° C. for 5 to 10 minutes. At this time, the light absorbing layer has a structure in which a compact-titanium oxide (c-$TiO_2$) and a mesoporous-titanium oxide (m-$TiO_2$) are sequentially laminated.

Before performing the spin coating, the substrate on which the electrode layer is laminated may be surface-treated by a UV-$O_3$ or $O_2$ plasma method.

In the step (B2), after the completion of the step (B1), the light absorbing layer may be annealed at 450 to 550° C. for 0.5 to 2 hours.

The term "annealing" used in the present invention means a method of removing a heat history and an influence by processing remaining in the internal structure of the material by moderately heating the metal material.

In the step (B3), after the completion of the step (B2), the perovskite compound is spin-coated on the light absorbing layer to prepare the substrate on which the perovskite layer is formed.

The spin coating may be performed at 2,000 to 3,000 rpm for 20 to 60 seconds.

In the step (B4), the perovskite solar cell may be prepared by spin-coating the hybrid structure on the perovskite layer, and more specifically, the step (B4) may be constituted by the following steps:

(B4a) laminating the hybrid structure on the substrate on which the perovskite layer prepared in the step (B3) is formed; and (B4b) preparing the perovskite solar cell to which the hybrid structure is adhered by pressing the substrate on which the hybrid structure is laminated using a laminator at 90 to 120° C.

The term "laminator" used in the present invention refers to a device for making a thick plate by bonding several layers of thin plates.

In the step (B4b), the perovskite solar cell may be prepared by bonding the hybrid structure using the laminator by applying pressure at a predetermined temperature condition.

The glass (230) may be located on the front and rear surfaces of the perovskite solar cell (220) formed in the large scale and inserted into the frame (210). In addition, the glass (230) may be coated with an ultraviolet coating film (not illustrated) to block ultraviolet rays passing through the bus stop (1).

The energy storage system (ESS) (300) may be constituted by a power conversion system (PCS) (310) for converting the electrical energy produced by the solar cell unit (200); an energy storage unit (320) for storing the electrical energy converted by the power conversion system (310); and an energy management system (EMS) (330) for controlling and managing the power conversion system (310) and the energy storage unit (320).

The energy storage system (300) may be located in the body unit (100) of the bus stop (1) and connected to the solar cell unit (200). For example, the energy storage system (300) may be located in a support formed to be connected to the perovskite solar cell (200) located in the body unit (100).

The power conversion system 310 may constituted by a connection unit (311) to be coupled with the solar cell unit (200); an inverter (312) that converts and outputs the electrical energy produced from the solar cell unit (200) to be transferred through the connection unit (311) to AC power; and a power output unit (313) that receives the AC power converted by the inverter (312) and converts and outputs the AC power into DC power.

The connection unit (311) is connected to store the electrical energy produced by the solar cell unit (200) in the energy storage system (300), and the electrical energy produced by the solar cell unit (200) may be transferred to the inverter (312) by the connection unit (311).

The inverter (312) may transfer the electrical energy produced from the solar cell unit (200) through the connection unit (311) and convert and output the electrical energy to AC power. More specifically, sunlight is produced by the solar cell unit (200) as electrical energy in the form of DC power, and the electrical energy in the form of DC power may be transferred by the connection unit (311) and converted and output into electrical energy in the form of AC power again.

The power output unit (313) receives the AC power converted by the inverter (312) and converts the AC power into DC power to output the converted DC power to configurations required for power, such as the fine dust sensor unit (110), the lighting unit (120), and the like.

The energy storage unit (320) may be constituted by a battery (321) for storing the DC power converted by the power conversion system (310); and a battery management system (BMS) (322) for sensing, managing, and controlling the state of the battery (321).

The battery (321) may store the DC power converted by the power conversion system (310), and more specifically, may store electrical energy in the form of DC power converted by the inverter (312). The electrical energy stored in the battery (321) may supply power required during the daytime when sunlight is not produced.

The battery management system (322) may sense, manage, and control the state of the battery (321). More specifically, the battery management system (322) serves to control batteries that may have different characteristics, may perform a protection control function of the battery (321), a life prediction control function of the battery, a battery charge and discharge control function, or the like, and may control the battery (321) to be safely used while showing the maximum performance of the battery.

In addition, the bus stop (1) using the large-scale perovskite solar cell may further comprise a bench unit (400) that is able to be cooled or heated using the electrical energy stored in the energy storage system (300); and a human body sensor unit (not illustrated) for sensing the human body to supply power according to the presence or absence of the sensed human body.

Figure 7:
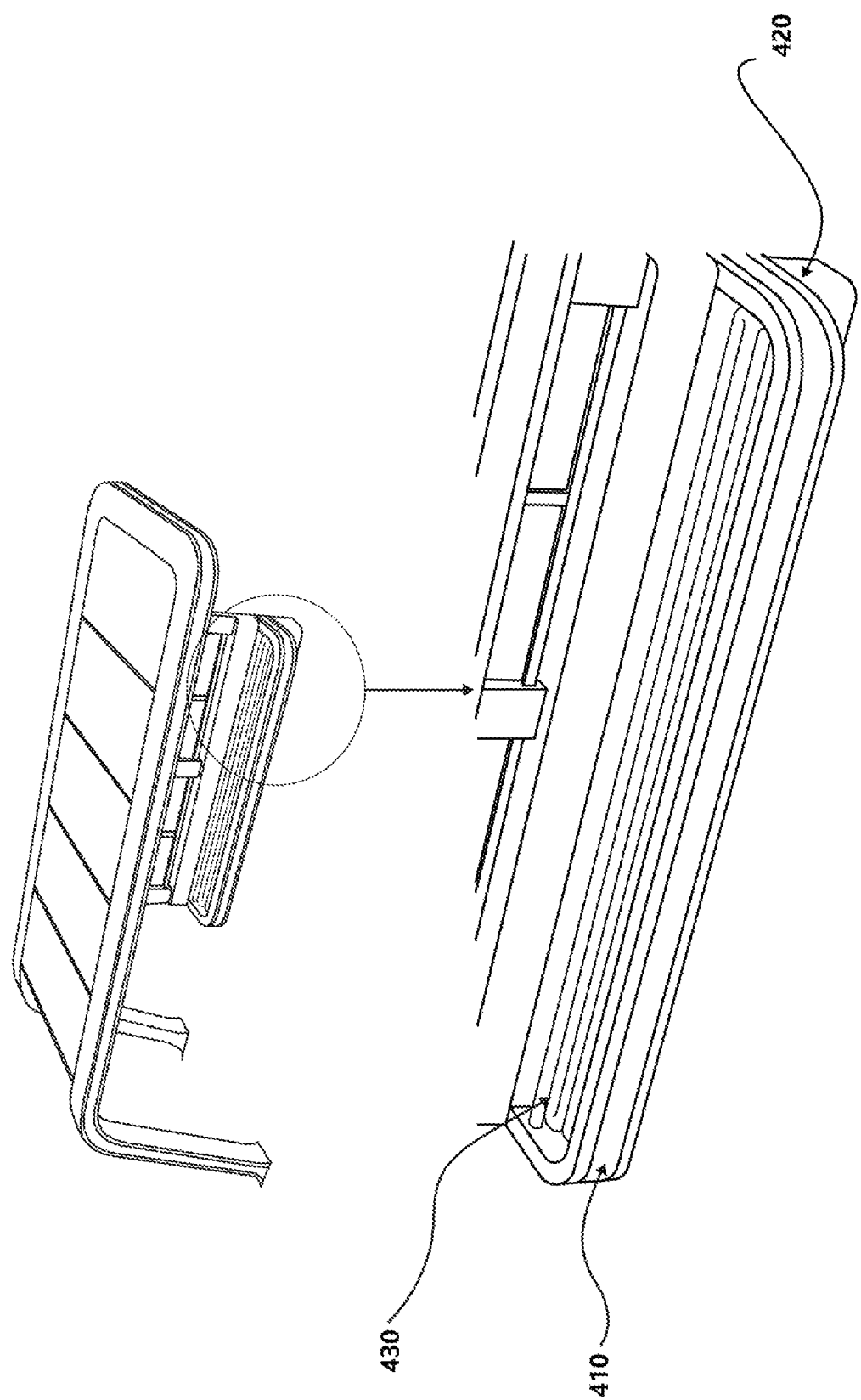
FIG. 7 is a diagram of enlarging a bench unit of the bus stop using the large-scale perovskite solar cell of the present invention.

FIG. 7 is a diagram of enlarging the bench unit (400) of the bus stop using the large-scale perovskite solar cell of the present invention.

Referring to FIG. 7, the bench unit (400) may comprise a bench body unit (410) formed in a longitudinal direction of the body unit (100); a bench support unit (420) for supporting both side surfaces of the bench body unit (410); and a cooling/heating unit (430) having a plurality of frames for cooling and heating the upper surface of the bench body unit (410).

The bench body unit (410) forms a space for people who are looking for the bus stop (1) to take a rest, and may be formed in the longitudinal direction of the body unit (100). In addition, the lighting unit (120) may be additionally attached to the upper surface of the bench body unit (410).

The bench support unit (420) is to support the bench body unit (410) and may be formed in contact with both sides of the bench body unit (410) and fixed to the ground.

The cooling/heating unit (430) is to cool and heat the bench body unit (410), and generates heat in the winter to keep the bench body unit (410) warm, and absorbs the heat in the summer to keep the bench body unit (410) cool.

More specifically, the cold/heating unit (430) is located inside the bench body unit (410) and may be configured as a cooling/heating element. The cooling/heating element may perform a temperature control using the electrical energy stored in the energy storage system (300).

Due to the cooling/heating unit (430), the passengers may wait for the bus warmly in the winter and wait for the bust coolly in the summer.

Next, the human body sensor unit (not illustrated) may be located in the lighting unit (120) and the bench unit (400), and is not limited thereto so long as the location may sense a human body entering and exiting the bus stop (1).

The human body sensor unit (not illustrated) may sense the human body approaching the bus stop (1) through infrared rays and supply the power to the lighting unit (120) and the bench unit (400). More specifically, when a human body (person) is sensed by the human body sensor unit (not illustrated), the power is supplied to the lighting unit (120) and the bench unit (400) of the bus stop (1) to emit the light by the lighting unit (120) and enable the cooling/heating of the bench by the bench unit (400). The energy stored in the energy storage system (300) may be saved by the human body sensor unit (not illustrated), thereby minimizing energy consumption.

In addition, the bus stop (1) using the large-scale perovskite solar cell may further comprise a screen unit (500) to which a display for advertising and checking a bus location is attached.

Figure 8:
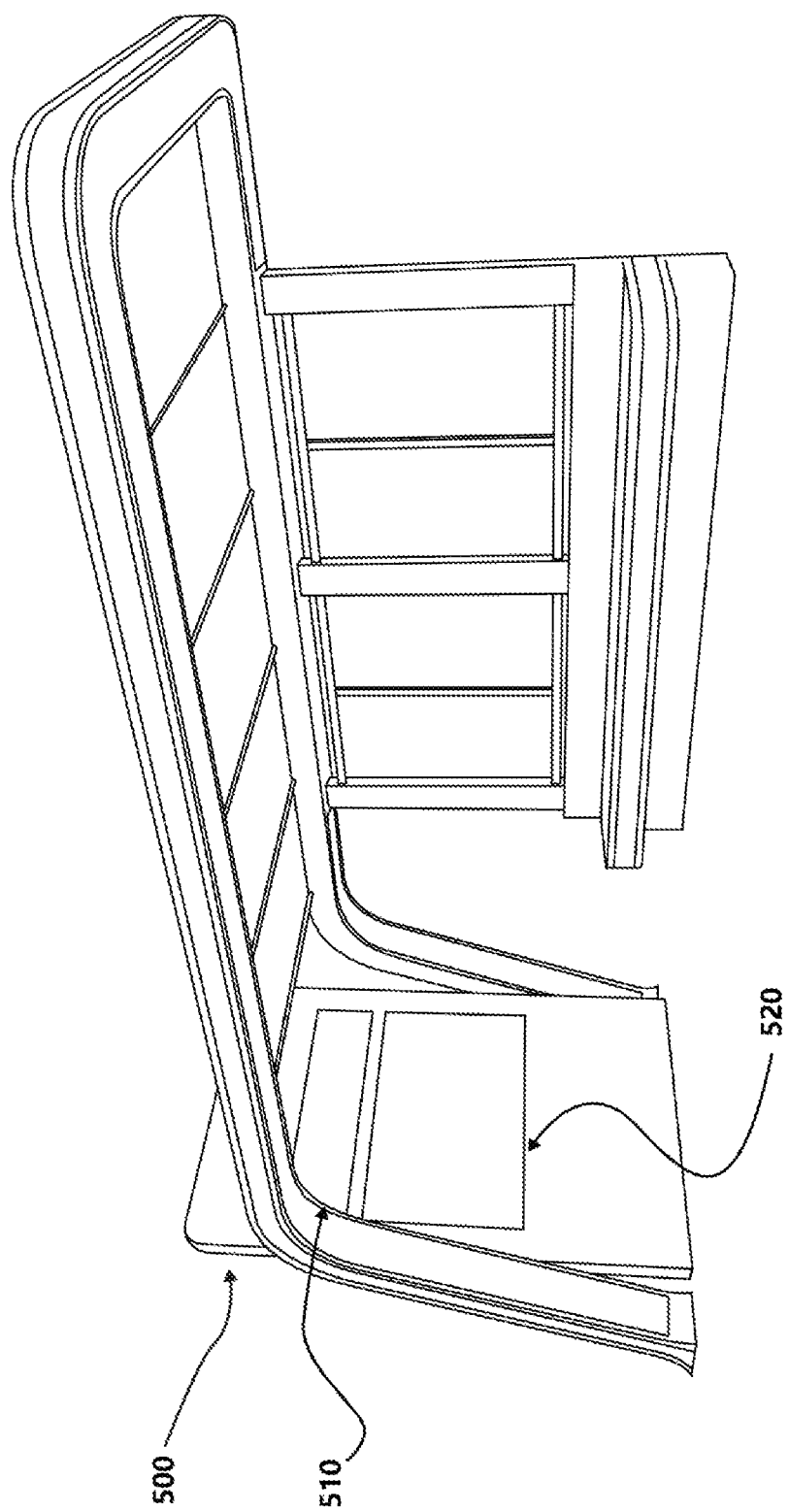
FIG. 8 is a diagram of including a screen unit in the bus stop using the large-scale perovskite solar cell of the present invention.

FIG. 8 is a diagram of including a screen unit in the bus stop using the large-scale perovskite solar cell of the present invention.

Referring to FIG. 8, the screen unit (500) may be divided into a top and a bottom to be formed as a single screen, and the form of the screen unit (500) may be easily applied depending on the installation location, space, and the like.

When the screen unit (500) is formed to be divided into the top and the bottom, the upper screen unit (500) becomes a first screen unit (510) and the lower screen part becomes a second screen unit (520). In this case, the first screen unit (510) may be formed to have the same vertical ratio as that of the second screen unit (520) and a horizontal ratio of 1:3 (first screen unit:second screen unit). On the first screen unit (510), a current location of the bus, an estimated time of arrival at the bus stop, and a current number of bus passengers are displayed. In addition, an advertisement may be transmitted to the second screen unit (520).

As described above, it will be understand to those skilled in the art that a technical configuration of the present invention can be easily executed in other detailed forms without changing the technical spirit or an essential feature thereof.

Therefore, the embodiments described above are illustrative in all aspects and should be understood as not being restrictive and the scope of the present invention is illustrated by claims to be described below rather than the detailed description, and it is to be interpreted that the meaning and scope of the claims and all changed or modified forms derived from the equivalents thereof are included within the scope of the present invention.

What is claimed is:
1. A bus stop using a solar cell, comprising:
a body unit fixed to a surface;
a solar cell unit for producing electrical energy from sunlight and comprising a perovskite solar cell; and
an energy storage system (ESS) for storing the electrical energy produced by the solar cell unit,
wherein the perovskite solar cell comprises:
a substrate;
an electrode layer laminated on the substrate and including a Fluorine doped Tin Oxide (FTO);
a light absorbing layer laminated on the electrode layer;
a perovskite layer laminated on the light absorbing layer and including a perovskite compound; and
a graphene-carbon nanotube hybrid structure laminated on the perovskite layer, and including:
a first graphene layer laminated on an upper surface of the perovskite layer;
a carbon nanotube layer coated on an upper surface of the first graphene layer;
a second graphene layer laminated on an upper surface of the carbon nanotube layer; and a polymer layer coated on an upper surface of the second graphene layer.

2. The bus stop using the solar cell of claim 1, wherein the body unit comprises
a fine dust sensor unit for visually expressing an air quality condition by measuring ultra-fine dust contained in the air; and
a lighting unit that emits light using the electrical energy stored in the energy storage system.

3. The bus stop using the solar cell of claim 2, wherein the fine dust sensor unit comprises
a measurement unit for measuring the ultra-fine dust contained in the air; and
a color changing unit for visualizing a color change according to an ultra-fine dust measurement value measured by the measurement unit.

4. The bus stop using the solar cell of claim 3, wherein the color changing unit changes the color into the following cover colors according to the ultra-fine dust concentration shown in [Table 1] below:

TABLE 1

| Ultra-fine dust concentration ($\mu g/m^3$) | Cover color |
|---|---|
| 0 to 15 | Blue |
| 16 to 30 | Green |
| 31 to 50 | Yellow |
| 51 to 75 | Orange |
| 76 or more | Red. |

5. The bus stop using the solar cell of claim 1, wherein the solar cell unit further comprises
a frame installed on one side of the body unit and to which the perovskite solar cell is fixed; and
glass positioned on front and rear surfaces of the perovskite solar cell.

6. The bus stop using the solar cell of claim 1, wherein the energy storage system comprises
a power conversion system (PCS) for converting the electrical energy produced by the solar cell unit;
an energy storage unit for storing the electrical energy converted by the power conversion system; and
an energy management system (EMS) for controlling and managing the power conversion system and the energy storage unit.

7. The bus stop using the solar cell of claim 6, wherein the power conversion system comprises
a connection unit to be coupled with the solar cell unit;
an inverter that converts and outputs the electrical energy produced from the solar cell unit to be transferred through the connection unit to AC power; and
a power output unit that receives the AC power converted by the inverter and converts and outputs the AC power into DC power.

8. The bus stop using the solar cell of claim 6, wherein the energy storage unit comprises
a battery for storing DC power converted by the power conversion system; and
a battery management system (BMS) for sensing, managing, and controlling a state of the battery.

9. The bus stop using the solar cell of claim 1, wherein the bus stop further comprises
a bench unit that is able to be cooled or heated using the electrical energy stored in the energy storage system; and
a human body sensor unit for sensing a human body to supply power according to the presence or absence of the sensed human body.

10. The bus stop using the solar cell of claim 9, wherein the bench unit comprises
a bench body unit formed in a longitudinal direction;
a bench support unit for supporting both side surfaces of the bench body unit; and
a cooling or heating unit having a plurality of frames for cooling or heating an upper surface of the bench body unit.

11. The bus stop using the solar cell of claim 9, wherein the human body sensor unit is located in the lighting unit and the bench unit, and
senses the human body approaching the bus stop through infrared rays.

* * * * *